United States Patent
Thies et al.

(10) Patent No.: US 8,120,182 B2
(45) Date of Patent: Feb. 21, 2012

(54) INTEGRATED CIRCUIT COMPRISING CONDUCTIVE LINES AND CONTACT STRUCTURES AND METHOD OF MANUFACTURING AN INTEGRATED CIRCUIT

(75) Inventors: Andreas Thies, Berlin (DE); Sirko Kramp, Langebrueck (DE); Helmut Schneider, Munich (DE); Rainer Florian Schnabel, Hoehenkirchen (DE)

(73) Assignee: Qimonda AG, Munich (DE)

( * ) Notice: Subject to any disclaimer, the term of this patent is extended or adjusted under 35 U.S.C. 154(b) by 248 days.

(21) Appl. No.: 12/354,140

(22) Filed: Jan. 15, 2009

(65) Prior Publication Data

US 2009/0184429 A1   Jul. 23, 2009

(30) Foreign Application Priority Data

Jan. 18, 2008   (DE) .......................... 10 2008 004 927

(51) Int. Cl.
  *H01L 23/48*   (2006.01)
  *H01L 23/52*   (2006.01)
  *H01L 29/40*   (2006.01)

(52) U.S. Cl. ........................................ 257/758; 257/750
(58) Field of Classification Search .......... 257/750–776, 257/E23.142, E21.495
See application file for complete search history.

(56) References Cited

U.S. PATENT DOCUMENTS

| 2003/0062564 A1* | 4/2003 | Kobayashi et al. ........... 257/306 |
| 2005/0280001 A1* | 12/2005 | Chang .............................. 257/68 |
| 2007/0284656 A1 | 12/2007 | Radigan et al. |

FOREIGN PATENT DOCUMENTS

WO   WO 2007/143387 A2   12/2007

\* cited by examiner

*Primary Examiner* — Cuong Q Nguyen
(74) *Attorney, Agent, or Firm* — John S. Economou

(57) ABSTRACT

An integrated circuit comprises a first conductive lines and second lines as well as contact structures being in contact with the first and second conductive lines. The first conductive lines are arranged in a first metallization level, and second conductive lines are arranged in a second metallization level arranged above the first metallization level. The second conductive lines are arranged above the contact structures, and a pitch of neighboring contact structures is equal to a pitch of neighboring second conductive lines. The distance between neighboring contact structures is smaller than 100 nm.

11 Claims, 15 Drawing Sheets

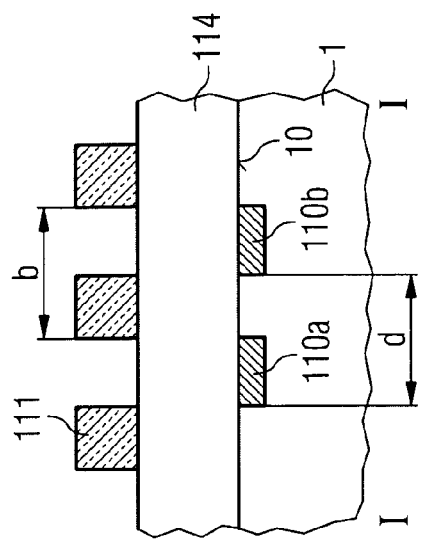
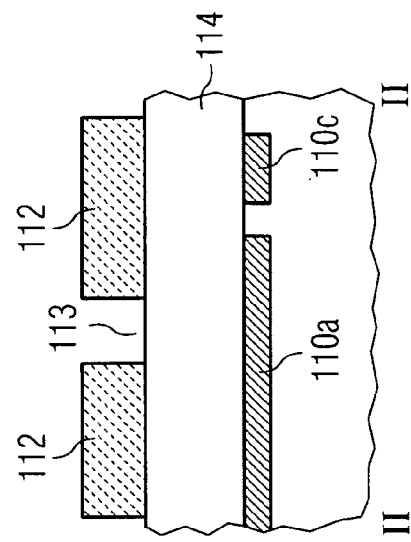
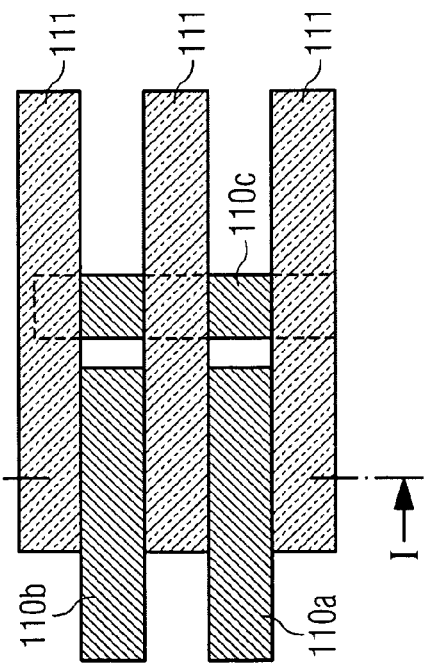
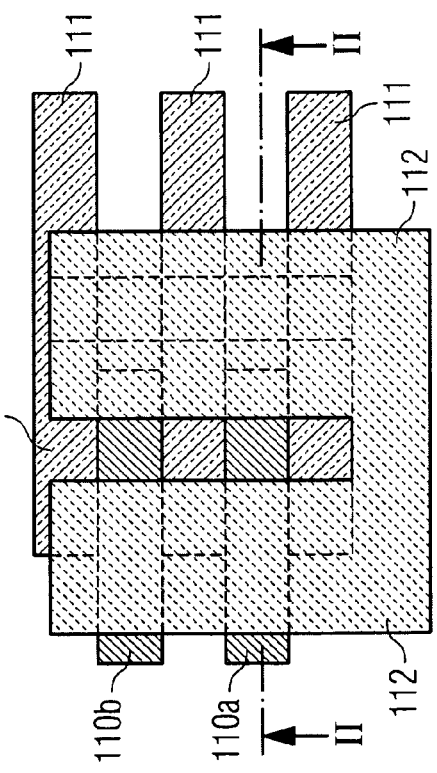

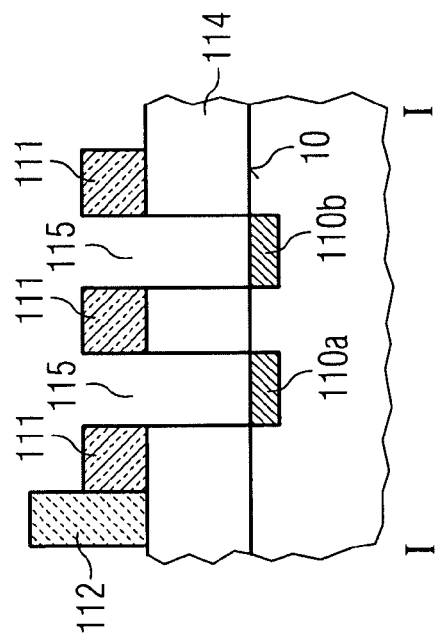
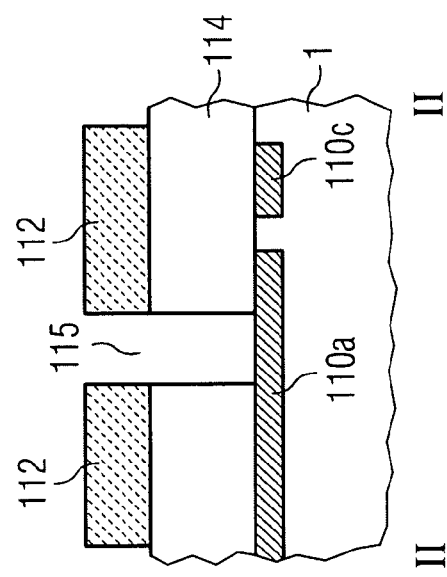
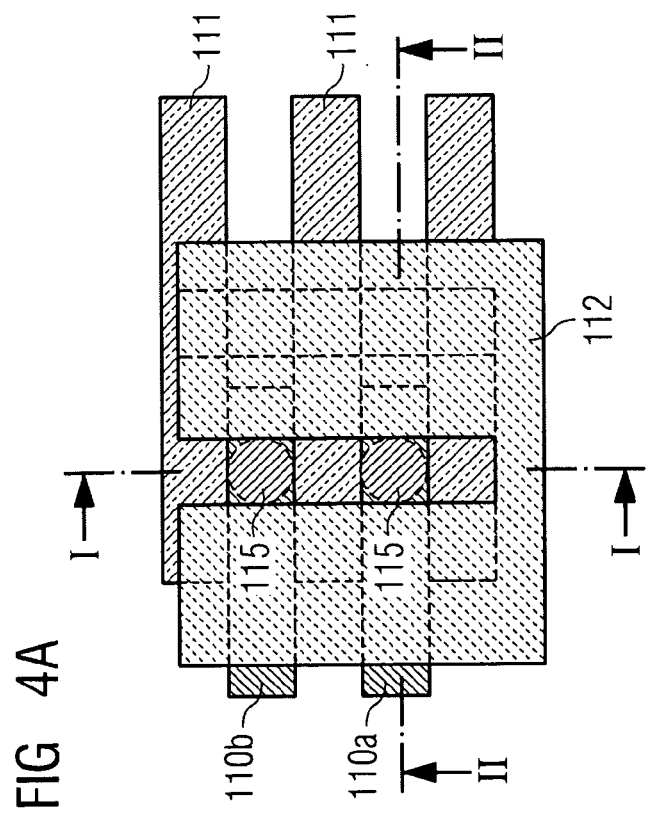

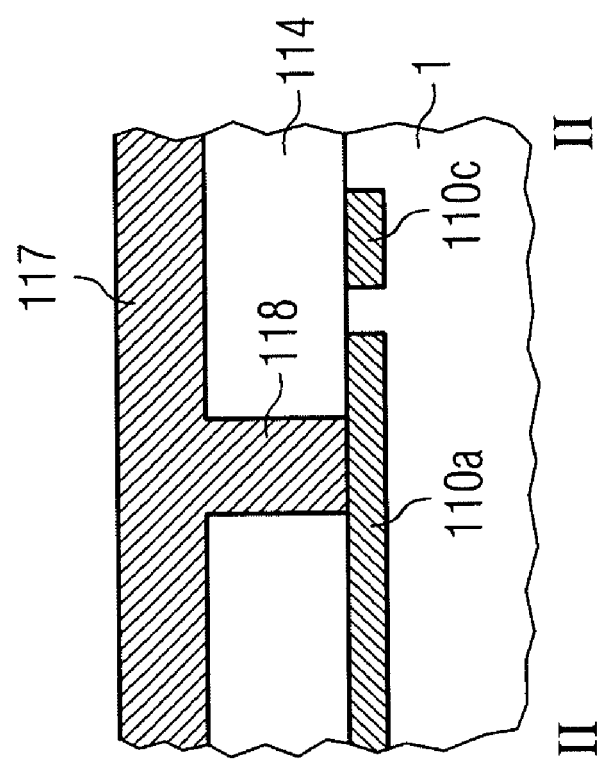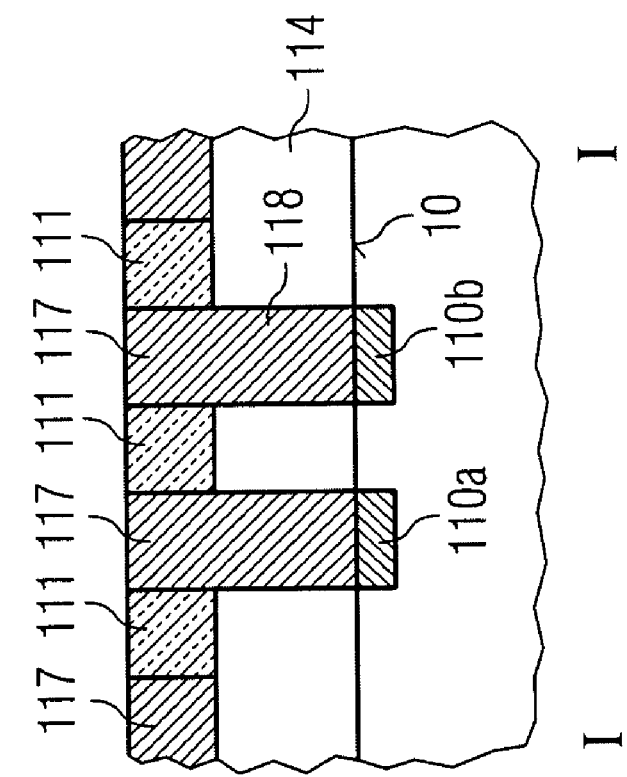

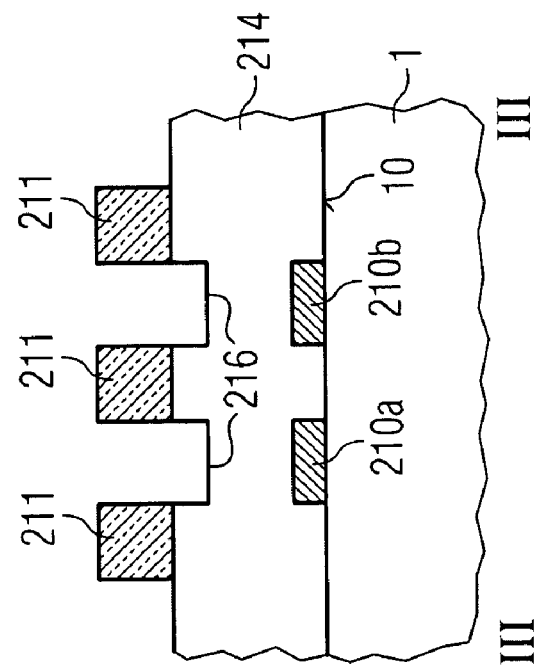
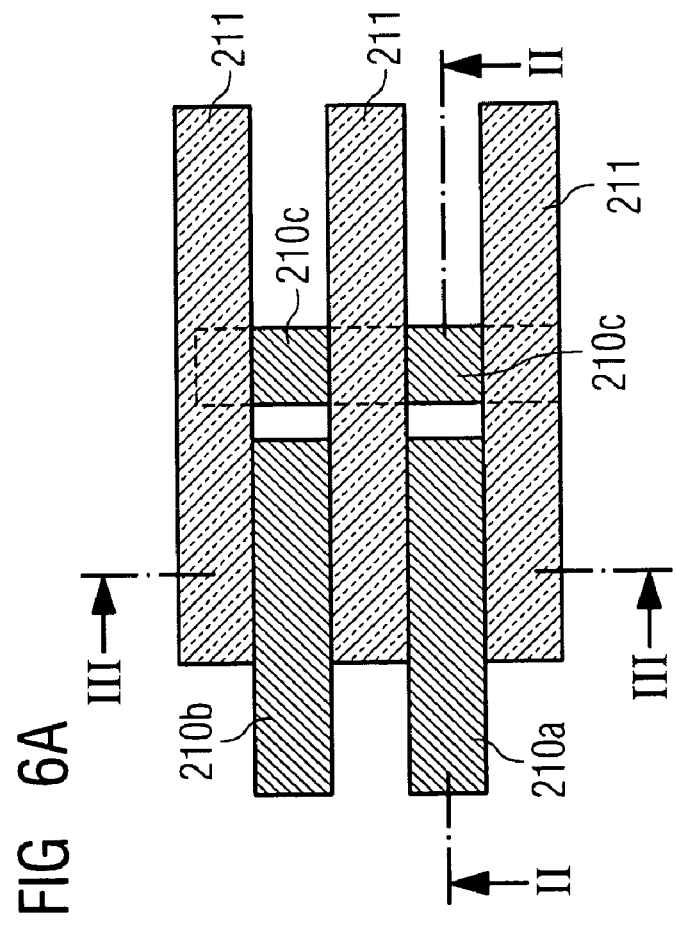

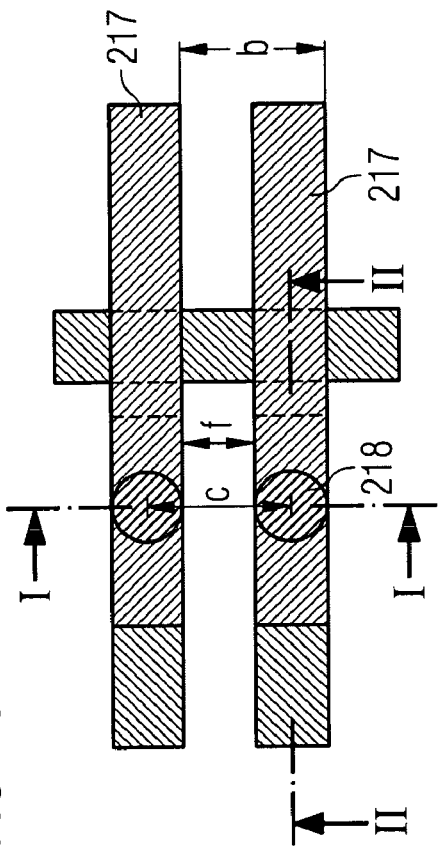
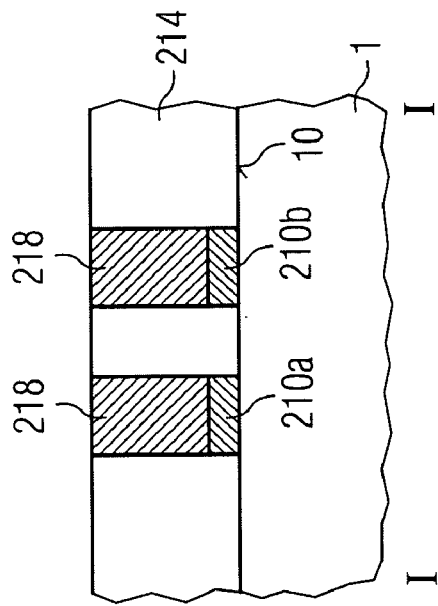
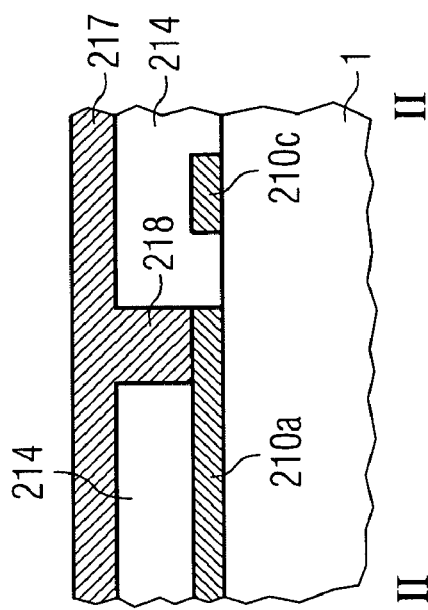

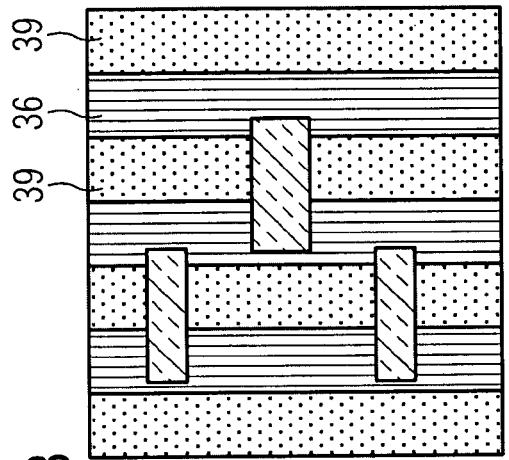
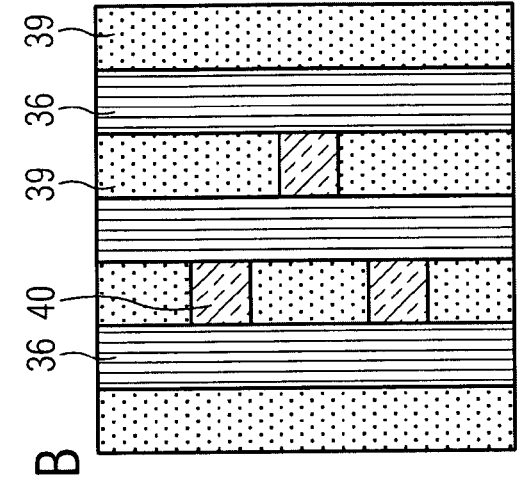
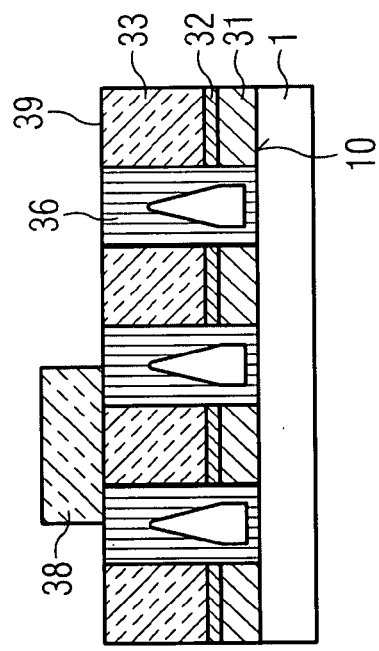

FIG 16C
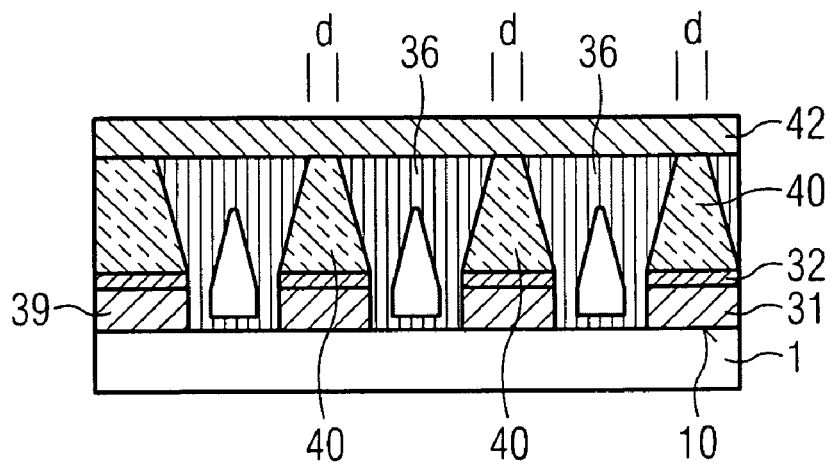
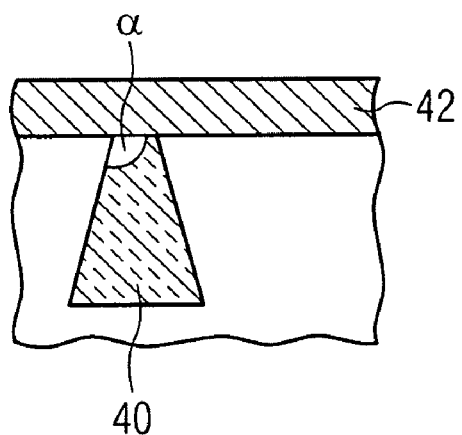
FIG 17A
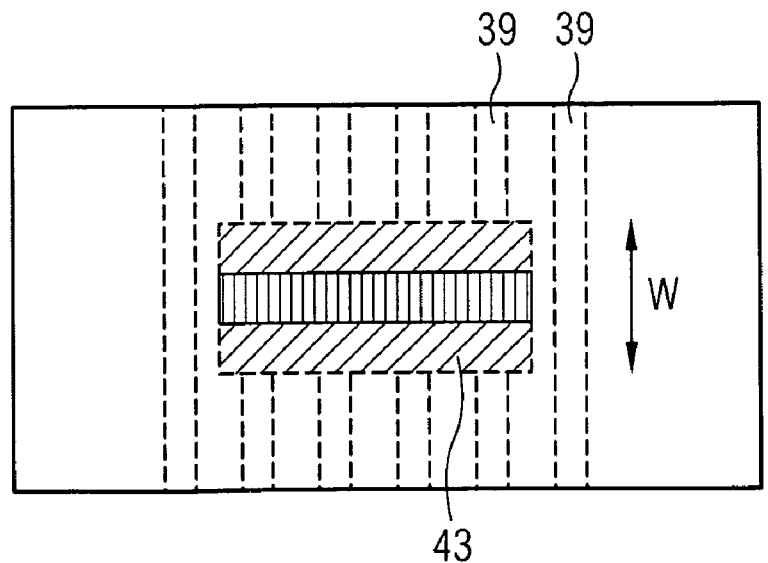

INTEGRATED CIRCUIT COMPRISING CONDUCTIVE LINES AND CONTACT STRUCTURES AND METHOD OF MANUFACTURING AN INTEGRATED CIRCUIT

This application claims priority to German Patent Application 10 2008 004 927.1, which was filed Jan. 18, 2008 and is incorporated herein by reference.

BACKGROUND

The present invention relates to a method of manufacturing an integrated circuit comprising metal lines and contact structures. The method further relates to an integrated circuit with metal lines and contact structures.

Integrated circuits comprising, for example, memory elements, logic circuits, and further electronic components that are arranged on a carrier material, typically comprise metal lines. Electronic signals are transferred from the integrated circuits to external components or further components of the integrated circuits by these metal lines. It is often possible, that several layers of metal lines are arranged on top of each other. For example, it may be desirable that certain metal lines are bridged by a suitable construction of lines and contact holes. For this purpose, a certain line must be routed towards an upper or a lower layer. Furthermore, two arrangements of metal lines which are arranged on top of each other may comprise the same pitch. In the course of continuous shrinking of integrated circuits it is desired to minimize the distance between neighboring metal lines. In the formation of metal lines in layers arranged on top of each other as well as in the formation of contact structures the problem exists, that a precise alignment of the corresponding arrangement of metal lines is difficult to realize. Therefore, it is desirable to develop further methods to realize integrated circuits with metal lines having the least possible distance from each other. At the same time, it is desirable to form contacts without the risk of generating shorts. Moreover, it is desirable to minimize the electrical coupling between conducting lines.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 2A and 2B show views of an arrangement when performing a method according to the present invention;

FIGS. 3A and 3B show views of the arrangement shown in FIG. 2 after depositing a photo resist material;

FIG. 4A to 4C show views of the arrangement after etching of contact structures;

FIGS. 5A and 5B show views of the arrangement after depositing a conductive material;

FIGS. 6A and 6B show views of the arrangement when performing the method according to a further embodiment of the invention;

FIG. 8A to 8C show views of the arrangement after depositing a conductive material;

FIGS. 14A and 14B show views of the substrate after forming and patterning a resist layer;

FIGS. 15A and 15B show views of the substrate after performing a further etching step;

FIG. 16A to 16C show cross sectional views of the substrate after forming an insulating filling;

FIGS. 17A and 17B show plan views of the substrate according to an embodiment.

DETAILED DESCRIPTION OF ILLUSTRATIVE EMBODIMENTS

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc., is used with reference to the orientation of the Figures being described. Since components of embodiments of the invention can be positioned in a number of different orientations, the directional terminology is used for purposes of illustration and is in no way limiting. Is to be understood that other embodiments may be utilized and structural or logical changes may be made without departing from the scope defined by the claims.

Figure 1A:
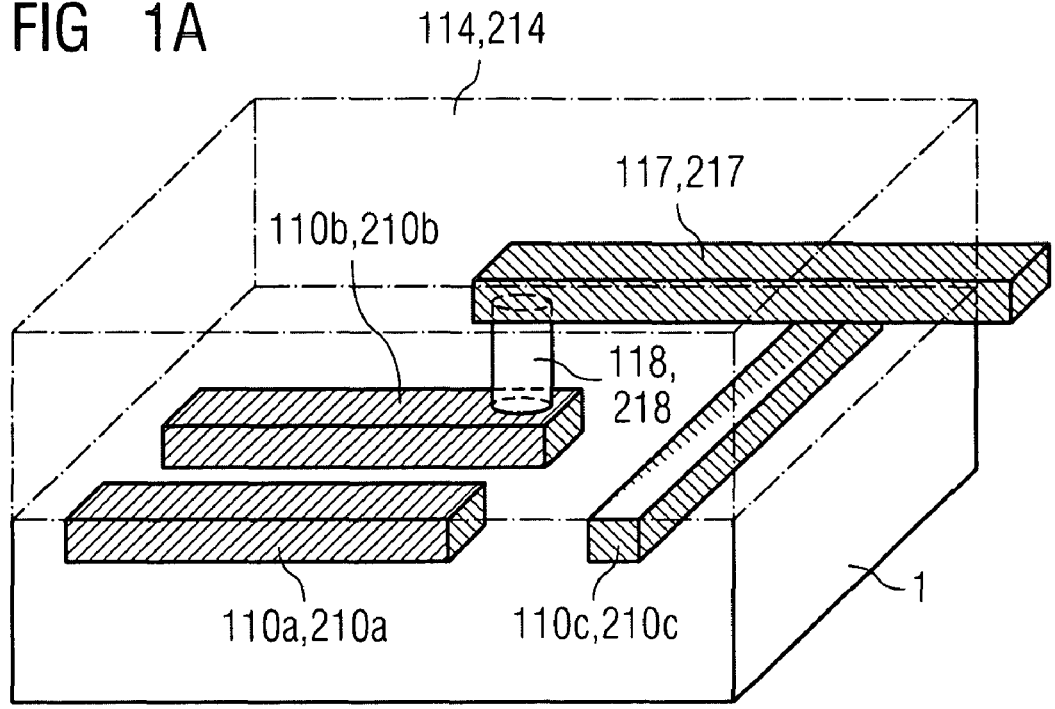
FIG. 1A shows a perspective view of an integrated circuit according to an embodiment of the invention.

FIG. 1A shows a perspective view of an integrated circuit according to an embodiment of the present invention. At the surface of a carrier layer 1, conductive lines 110a, 110b, 110c and 210a, 210b, 210c are formed. The first conductive lines are arranged in a first metallization level. A second metallization level comprising a second conductive line 117, 217 is arranged over the first metallization level. Contact structures 118, 218 are arranged such that they contact the first and the second conductive lines. The conductive lines are electrically connected through the contact structures and are in contact with them. As shown in FIG. 1A, the second conductive lines are arranged directly above the contact structures.

Figure 1B:
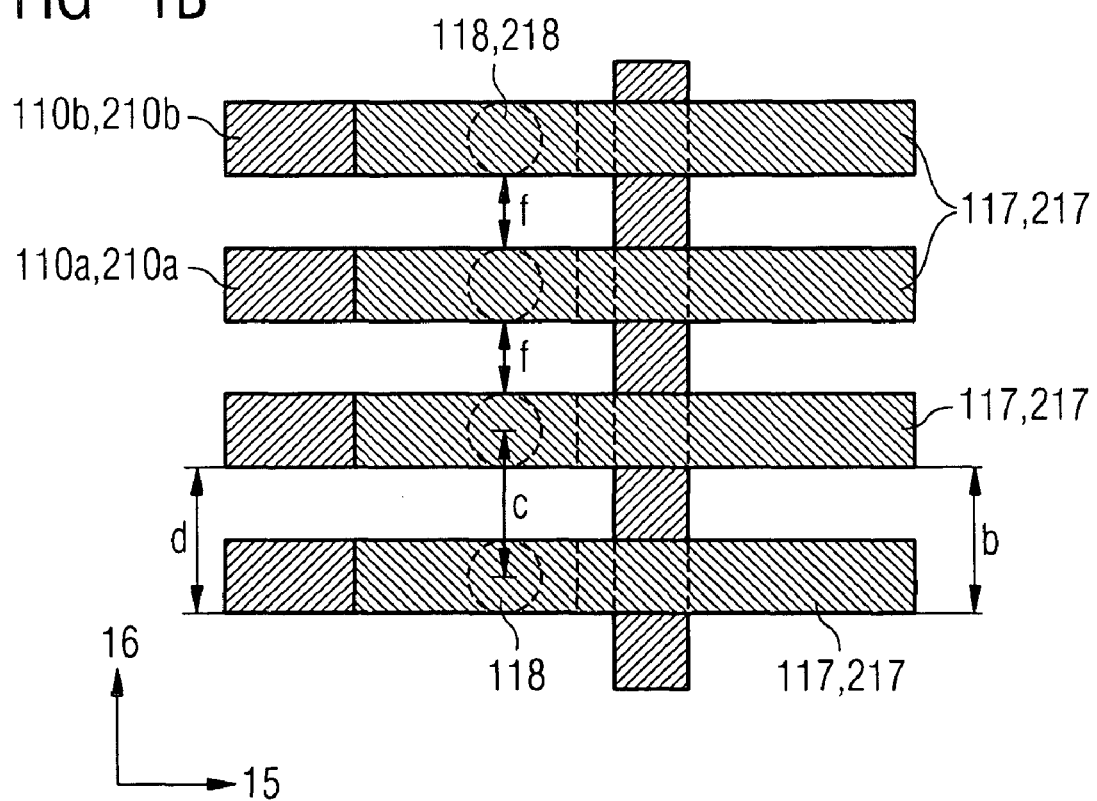
FIG. 1B shows a schematic plan view of an integrated circuit according to an embodiment of the invention.

As is shown in FIG. 1B neighboring first metal lines 110a, 110b, 210a, 210b are arranged at a pitch d. In this context the pitch refers to the sum of the conductive line width and the distance between conductive lines, or to the sum of the line width and the line distance, or to the sum of the width of contact structures and the distance between contact structures. Neighboring second conductive lines 117, 217 are arranged at a pitch b. Neighboring contact plugs, or contact structures 118, 218 are arranged at a pitch c. The pitch c between neighboring contact structures is equal to the pitch b between neighboring second conductive lines. Furthermore, the distance f between neighboring contact structures is less than 100 nm. The distance f between neighboring contact structures can be smaller than 80 nm, for example, smaller than 70 nm. As a further example, the distance f between neighboring contact structures can be smaller than 50 nm or even smaller than 40 nm. The distance refers in this example to the smallest distance between neighboring contact structures.

According to an embodiment, the pitch b of second metal may be equal to the pitch d between first conductive lines. A periodic arrangement of first and second conductive lines may be arranged in the first or second metallization level. Each arrangement may, for example, comprise more than 10 conductive lines at a constant pitch. In an arrangement of more than 10 contact structures the contact structures may be arranged at a constant pitch.

According to an embodiment, the first and second conductive lines may extend along a first direction 15. The contact structures 118, 218 may be arranged along a line which extends into a second direction 16. The second direction may run approximately perpendicular to the first direction. The expression "approximately perpendicular" has in this context the meaning that the angle between the first and the second direction 15, 16 may be 90°±2°.

The integrated circuit may be a memory component, for example, a DRAM or a non-volatile memory component. The first metallization level may for example be a M0 wiring layer, and the second metallization level may be a M1 wiring layer. The arrangement described may, for example, implement a bus-rearrangement that bridges a certain metallization layer. In case that the contact structures extend along the second direction 16, a bus-rearrangement with equal length of conductive lines in the first and second metallization layer may be realized. This may lead to a reduced capacitive coupling between conductive lines, for example, in a DRAM arrangement.

The integrated circuit may as well be a logic or ASIC circuit. Furthermore, the first conductive lines may comprise different materials, respectively. For example, the first conductive lines may comprise a first material such as aluminum. Furthermore, the second conductive lines may comprise a second material, which is different from the first material. As a consequence, both conductive lines may comprise differing resistivity. By the arrangement of conductive lines and contact structures as described, the problem that different lengths of the conductive lines in the first and the second metallization layer may lead to differing values of resistivity, may be prevented.

The material of the first conductive line can be any conductive material such as, for example, aluminum, polysilicon, tungsten and other metals, which are typically used. The material of the second conductive lines can for example be a material suitable to perform a damascene-method. Examples comprise copper, gold, or silver. Alternatively, also metals such as aluminum, polysilicon, tungsten and other metals, which are typically used, may form the second conductive lines.

According to an embodiment of the invention, the method comprises forming first conductive lines 110a, 110b, 110c in a carrier material, as shown in FIGS. 2A and 2B. The carrier material may for example be a semiconductor substrate. The term "substrate" or "semiconductor substrate" used in the context of the present specification, may be any semiconductor-based structure which comprises a semiconductor substrate. For example, a silicon substrate may be a silicon-on-insulator (SOI) substrate, a silicon-on-sapphire (SOS) substrate, a doped or undoped semiconductor material, an epitaxial silicon layer on a crystalline base material, and further semiconductor structures. The semiconductor does not necessarily be silicon based. The semiconductor could as well, among others, be silicon-germanium, germanium or gallium arsenide. Electronic components may already be formed in the substrate. For example, various electronic components may be formed below the substrate surface 10 shown in FIG. 2B. Furthermore, different layers may be embedded in the substrate material. The carrier material 1 can as well be any isolating material, for example glass or an organic carrier material. The conductive lines 110a, 110b, 110c may be formed underneath the carrier surface or above the carrier surface. Additionally, an intermediate layer 114 may be arranged above the carrier surface 10. The intermediate layer 114 may comprise typical dielectric materials. The layer may as well comprise another semiconductor material. The intermediate layer 114 may as well comprise several layers. Hard mask lines 110 are formed by known methods over the intermediate layer 114. A suitable hard mask material, which, for example, can be etched selectively to the material of the intermediate layer 114 may be deposited and patterned by means of a suitable photo mask. The hard mask material may as well comprise several layers. The photo mask may comprise, for example, a lines/spaces pattern at a pitch that corresponds to the pitch of the first conductive lines 110a, 110b. The width of the first and second conductive lines may be different, or may be equal. After exposing and developing a suitable photo resist layer, the hard mask layer is etched so that hard mask lines 111 are formed. Hard mask lines 111 may for example be aligned relative to the first conductive lines. The line width of the hard mask lines may be equal to the distance between neighboring hard mask lines, but may as well be smaller or larger than this distance.

An example of a resulting structure is shown in FIG. 2. FIG. 2A shows a plan view of the structure, while FIG. 2B shows a cross section between I and I. As can be seen, first conductive lines 110a, 110b are arranged at a pitch d, which corresponds to the sum of the line width and the line distance. The pitch b of hard mask lines 111 may be equal to the pitch d. According to an embodiment, a resist layer for patterning contact structures may be deposited, and an etching step using the hard mask lines as an etch mask may be performed.

For example, a suitable resist layer 112 is arranged above the hard mask lines 111 and subsequently patterned. Resist layer 112 may, for example, be a photo resist layer as typically used. The layer may as well be a further hard mask layer which may be patterned photo lithographically and which is selectively etchable with respect to the hard mask lines 111. Subsequently, resist layer 112 is patterned according to known methods, so that an opening is formed in the resist material which overlays at least two hard mask lines 111. For example, the opening may be a slit that intersects hard mask lines 111 approximately perpendicular. The opening may as well comprise the shape of a long hole, wherein the long hole is formed so as to intersect at least two hard mask lines. For example, such a long hole may intersect five, ten or even more of the hard mask lines. Opening 119 may intersect hard mask line 111 approximately perpendicular or in any other arbitrary angle. After forming the opening 119 in the resist material 112, a portion 113 of the surface of the intermediate layer 114 is uncovered.

An example of the resulting structure is shown in FIGS. 3A and 3B. FIG. 3A shows a plan view of the structure, while FIG. 3B shows a cross section between II and II parallel to the hard mask lines. Subsequently, an etching step is performed, in which the material of the intermediate layer 114 is etched selectively with reference to the material of the hard mask lines 111 and the resist layer 112. By means of this etching step contact holes are formed, which may extend for example down to the surface of the first conductive lines 110a, 110b.

FIG. 4A shows a plan view of the resulting structure, and FIG. 4B shows a cross sectional view of the resulting structure. The cross sectional view of FIG. 4B is taken between I and I and runs approximately perpendicular to hard mask lines 111. FIG. 4C shows a cross sectional view between II and II parallel to hard mask lines 111 in a gap between adjacent hard mask lines. As is shown, the surface of the intermediate layer 114 is covered with the resist layer 112 except in a portion in which the contact hole 115 is etched.

After removing the remaining resist material 112, and optionally after removing the remaining hard mask material, an electrically conductive material such as, for example, copper is filled into the resulting openings. Further examples of materials comprise gold and silver and such materials which may be deposited, for example, in a so called damascene-method. Subsequently, a planarizing step such as a CMP (chemical mechanical polishing) step or a back-etching step is performed so that as a result a planar surface is formed.

FIG. 5A shows a cross-sectional view of the resulting structure between I and I. FIG. 5B shows a cross sectional view of the resulting structure between II and II parallel to the resulting second conductive lines 117. As is shown in FIGS. 5A and 5B, contact elements 118 are electrically connected to first conductive lines 110a, 110b. Second conductive lines 117 are connected to first conductive lines 110a, 110b via contact elements 118. As shown in FIG. 5B, contact elements 118 and conductive lines 117 may be formed from the same material and may be formed by one or more joint deposition steps. The second conductive lines may have a line width, which is equal to the distance between adjacent conductive lines. The second conductive lines may as well have a larger line width and correspondingly a smaller distance. This may be advantageous, if conductive lines of especially low resistivity are to be formed. Conventionally, the minimum distance between conductive lines has been limited to around 150 nm by the achievable tolerances of the alignment. By means of the inventive method it is possible to further reduce the minimum distance so that wider conductive lines can be realized at a given pitch.

Accordingly, an integrated circuit may comprise first conductive lines, wherein the first conductive lines are arranged in a first layer, second conductive lines, wherein the second conductive lines are arranged in a second layer over the first layer, and contact structures being in contact with the first and the second conductive lines, wherein the contact structures are arranged in a self aligned manner to the second conductive lines.

For example, the first and the second conductive lines may extend along a first direction. The contact structures may be arranged along a line which extends in a second direction. The second direction may run perpendicular to the first direction.

The first conductive lines may comprise a first material and the second conductive lines may comprise a second material being different from the first material. Alternatively, the first conductive lines may comprise a first material, and the second conductive lines comprise the first material.

According to a further embodiment of the present invention, the second lines as well as the contact holes are etched in a first step using patterned hard mask lines 211 and in a second step using patterned resist layer 212 as a mask. Starting point is a structure similar to the one shown in FIGS. 2A and 2B. In the embodiment described the same materials as in the embodiments of FIGS. 2 to 5 may be used. As shown in the present example, first conductive lines 210a, 210a may be arranged over a carrier surface 10 such that, for example, the bottom of the lines is arranged at the same height as the surface of the carrier. An intermediate layer 214 may be arranged above first conductive lines 210a, 210b. Then, hard mask lines 211 are formed similarly to the aforementioned method, wherein the hard mask lines are, for example, aligned relative to first conductive lines 210a, 210b. Subsequently, the material of the intermediate layer 214 is etched selectively to the hard mask material by use of hard mask lines 211, thereby obtaining etched lines 216.

FIG. 6B shows a cross sectional view of the resulting structure between III and III. As is shown, lines 216 are etched in the intermediate layer 214. The depth of the lines 216 is chosen such that they do not contact first conductive lines 210a, 210b. Subsequently, a resist layer 212 is formed and suitably patterned. Resist layer 212 may be similar to resist layer 112 described above. Furthermore, resist layer 212 may be patterned in the same manner as described above. Next, a step for etching the material of the intermediate layer 214 is performed using patterned resist layer 212 as an etching mask.

Figure 7B:
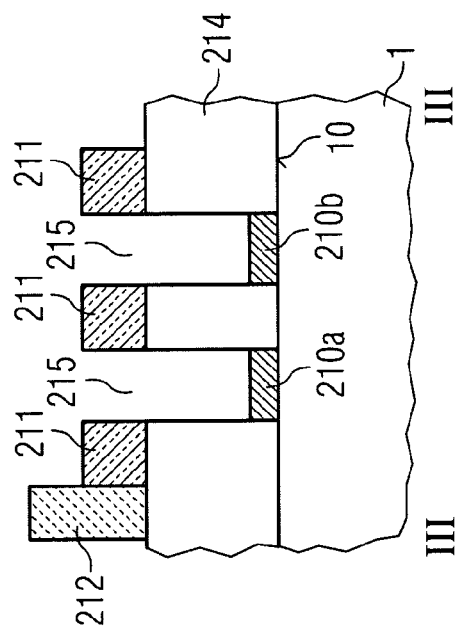
FIG. 7A to 7C show views of the arrangement after an etching step.
Figure 7C:
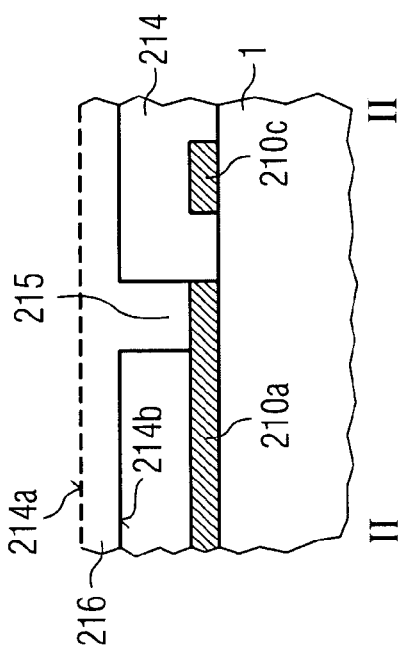
Figure 7A:
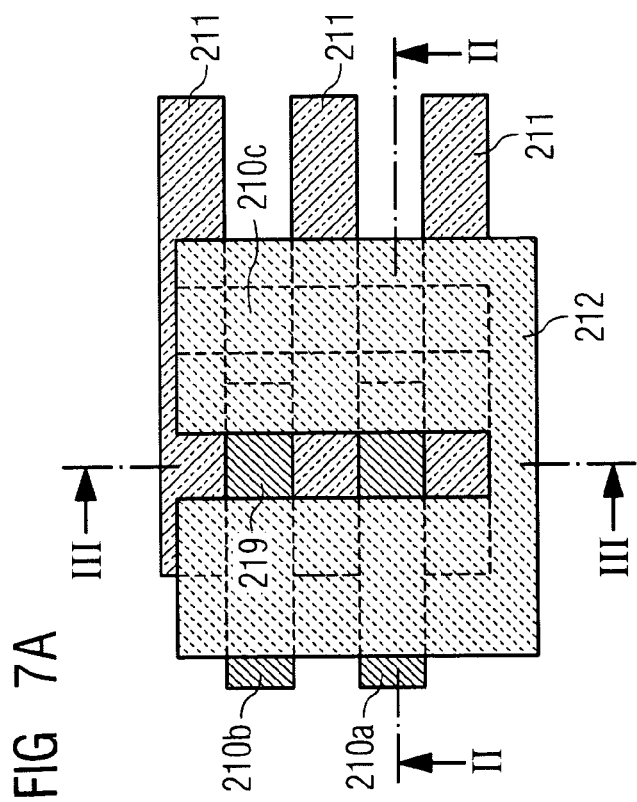

As a result, the structure shown in FIG. 7A to 7C may be obtained. As shown in FIG. 7B, contact holes 215 between adjacent hard mask lines 211 are formed within the opening 219 of the resist layer 212. Contact holes 215 may, for example, extend down to the surface of the first conductive lines 210a, 210b. FIG. 7B shows a cross sectional view between III and III. As can be seen, a contact hole 215 is formed at the location, at which the opening 219 in the resist material 212 is formed in FIG. 7A. FIG. 7C shows a cross sectional view of an integrated circuit between II and II. Grooves 216 for housing the conductive lines are etched into the surface of the intermediate layer 214. Reference numeral 214b refers to the etched surface, and reference numeral 214a refers to the non-etched surface. After removing the remaining resist material 212, and optionally after removing the remaining hard mask material, an electrically conductive material is deposited and planarized as has been described above with reference to FIG. 5B.

As a result, the structure shown in FIGS. 8A to 8C is realized. As shown in FIG. 8A, second conductive lines 217 are arranged at a pitch b. Furthermore, contact elements 218 are arranged at the same pitch c. In addition, the distance f between adjacent contact structures 218 is less than 100 nm. FIG. 8B shows a cross sectional view between I and I while FIG. 8C shows a cross sectional view between II and II. Again, the width of the second conductive lines 217 is equal to the distance between adjacent second lines 217 or may be different as has been explained above.

Figure 9:
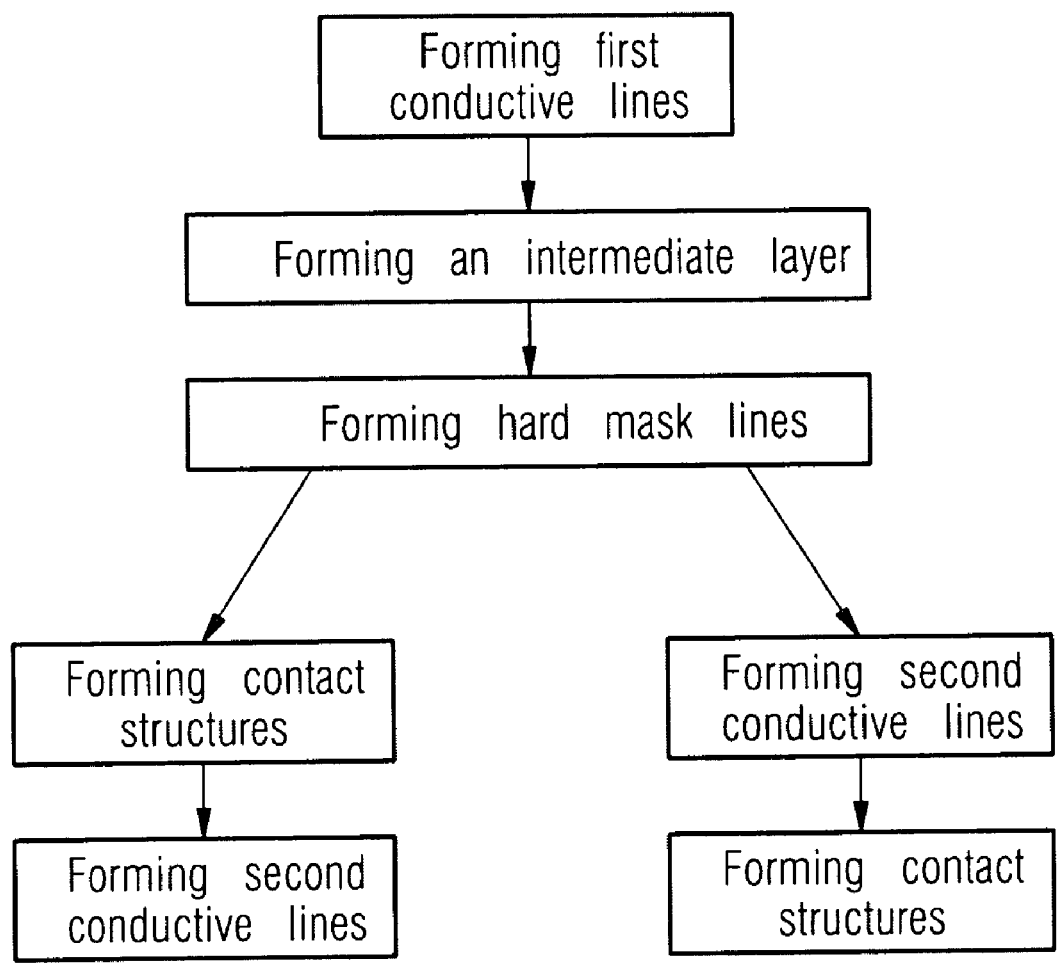
FIG. 9 shows a schematic illustration of the method according to an embodiment of the invention.

FIG. 9 illustrates the steps of the method according to the invention. The method comprises forming first conductive lines in a first metallization layer, forming an intermediate layer over the first metallization layer, forming contact structures which are connected to the first conductive lines in the intermediate layer, and forming second lines in a second metallization level over the first metallization level. The second lines are connected to the contact structures. Forming the second lines comprises forming lines of a hard mask layer such that a first etch mask is generated. The first etch mask is used to define the contact structures. According to an embodiment of the present invention, first conductive lines are formed. The conductive lines may be arranged on or above the surface of suitable carrier material, as described above. Then, an intermediate layer is formed and hard mask lines are formed from a suitable hard mask material. In a subsequent step, contact structures and conductive lines are formed. For example, contact structures may be etched using the hard mask lines, and subsequently conductive lines are formed. According to a further embodiment, the conductive lines are formed first, followed by a formation of the contact structures. It is as well contemplated by a suitable process sequence, that contact structures and conductive lines are formed simultaneously. For example, a photo resist material may be used to form the contact structures. For instance, portions of the gap between the hard mask material may be covered by a suitable photo resist material, so that the contact structures are formed at predefined positions. Due to the fact that, according to an embodiment of the present invention, the same hard mask lines may be used in the formation of the conductive lines as well as in the formation of the contact structure, a self alignment of the contact structures relative to the conductive lines is realized. Accordingly, it is possible to prevent undesired shifts or offsets between conductive lines and contact structures.

FIGS. 10 to 18 illustrate a further embodiment of the present invention. According to the method described, contacts will be formed in a self-aligned method with respect to underlying conductive lines. The method as described hereinafter can be employed for patterning any kind of metal layers.

On the surface 10 of a semiconductor substrate 1, as has been described above, a first conductive layer 31 is formed by generally known methods. First conductive layer 31 may have a thickness of approximately 20 nm to 100 nm, for example, 50 nm. On top of first conductive layer 31 an etch stop layer 32 is formed. Etch stop layer 32 is conductive and may have a thickness of approximately 5 nm to 30 nm, in an embodiment 10 nm. On top of the etch stop layer, a second conductive layer 33 is formed. The second conductive layer 33 may, for example, have a thickness of approximately 50 nm to 200 nm, for example, 150 nm. The material of the second conductive layer 33 may be the same as the material of the first conductive layer 31. Alternatively, the first and second conductive layers may be different from each other. The material of the etch stop layer is selected so that the second conductive layer may be etched approximately selectively with respect to the etch stop layer 32. To be more specific, the etching rate of the second conductive layer is much higher in a specific etchant than the etching rate of the etch stop layer 32. Accordingly, etching the second conductive layer will stop on the etch stop layer 32. Examples of the material of the first and second conductive layers comprise tungsten, Al, (doped) Silicon and others that are generally well known. The etch stop layer may, for example, comprise titanium nitride (TiN). Other materials that are electrically conducting and show a differential etching rate with a specific etchant with respect to layer 33 can be chosen. As is clearly to be understood, according to a further embodiment, the layer stack may comprise a first conductive layer 31 and a second conductive layer 33, the first conductive layer being different from the second conductive layer. In this case, no etch stop layer is present between the first and the second conductive layer. Nevertheless, depending on the specific etching chemistry used, etching the second conductive layer 33 may stop when the first conductive layer 31 is reached.

Figure 10:
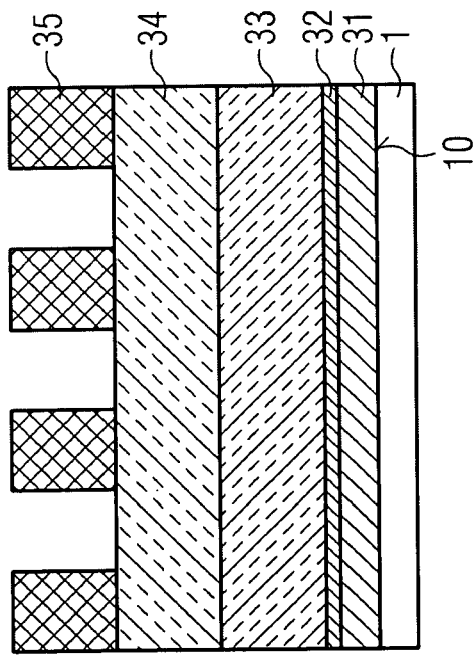
FIG. 10 shows a cross-sectional view of a substrate according to a further embodiment.

On top of the second conductive layer 33 a suitable hard mask layer 34 is formed. For example, hard mask layer 34 may comprise carbon or silicon oxide (SiO2) or any combination thereof. On top of the hard mask layer 34, a suitable resist material such as a photo resist material 35 may be formed. Thereafter, resist layer 35 is patterned, for example, using a photo lithographic patterning method. For example, resist layer 35 may be patterned to form a line/space pattern. FIG. 10 shows a cross sectional view of an example of a substrate after these processing steps.

Figure 11B:
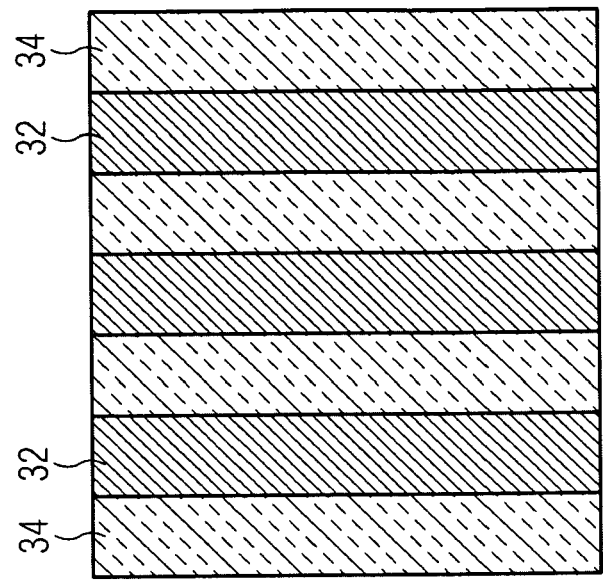
FIGS. 11A and 11B show views of the substrate after a further processing step.
Figure 11A:
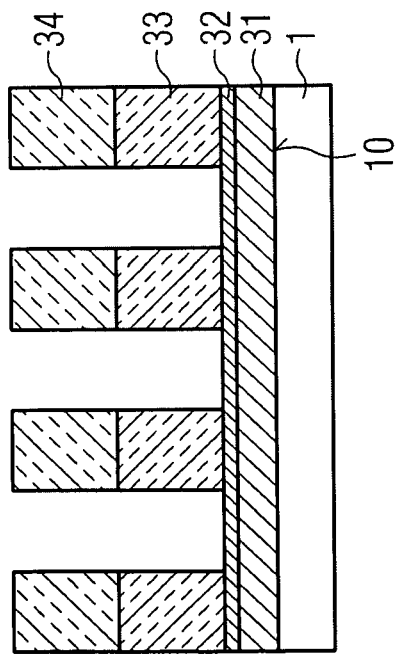
Figure 12:
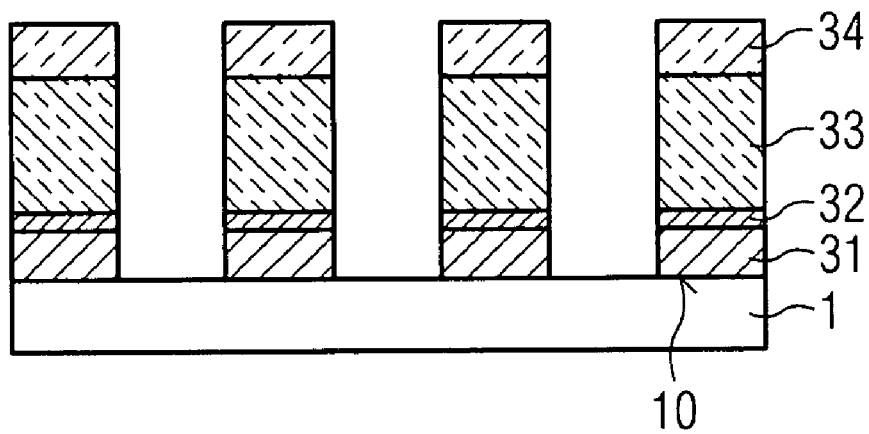
FIG. 12 shows a cross sectional view of the substrate after a further etching step.

After patterning the resist layer 35, further etching steps are performed to etch the hard mask layer 34 and second conductive layer 33. For example, a dry anisotropic plasma etch process may be used for performing this etching step. This etching step may stop on the etch stop layer 32. FIGS. 11A and 11B show an example of a substrate after these processing steps. FIG. 11A shows a cross sectional view, showing that the second conductive layer 33 is patterned to form conductive lines. For example, this etching may be accomplished in a manner so that vertical sidewalls are obtained. According to a further example, the sidewalls may be non-vertical. According to an embodiment, the etching may be a tapered etching so that a line width of the conductive lines in an upper portion is smaller than in a lower portion. Between adjacent lines of the second conductive layer 33, the surface of the etch stop layer 32 is uncovered. FIG. 11B shows a plan view of an example of the resulting substrate. As is shown in FIG. 11B, lines of the hard mask layer 34 are formed, the uncovered portions of the etch stop layer being disposed between the lines of the hard mask layer.

Thereafter, a further etching may be performed so that portions of the substrate surface 10 are uncovered. Using a suitable anisotropic etch process, etch stop layer 32 may be etched, followed by first conductive layer 31. As a result, the structure shown in FIG. 12 may be obtained. As can be seen, lines comprising a layer stack comprising first conductive layer 31, etch stop layer 32 and second conductive layer 33 are formed over the substrate surface 10. This etching may provide vertical or nearly vertical sidewalls. According to an embodiment, this etching step may be a tapered etching step, so that the top width of the resulting contacts may be smaller than a bottom portion of the contacts 40. Moreover, a diameter of the resulting contacts may be smaller than a line width of the first conductive lines 39. Hard mask residues can be removed if necessary after this process step. For example, a carbon hard mask may be removed by a plasma strip process.

Figure 13:
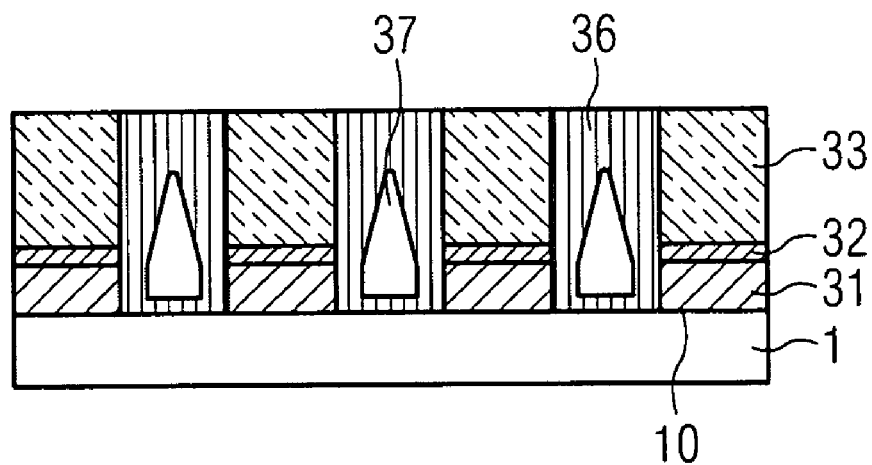
FIG. 13 shows a cross sectional view of the substrate after filling the gaps.

Thereafter, a suitable insulating material may be filled in the gaps between adjacent lines. For example, silicon oxide may be filled into the gaps. Excess insulating material above layer 33 can be removed, e.g., by a following CMP (chemical mechanical polishing) step or by a recess etch. For example, the silicon oxide fill 36 may be formed by employing different deposition methods to form different silicon oxide layers. For example, first, a silicon oxide liner may be deposited, followed by a HDP (high density plasma) deposition step. As a result, an oxide fill 36 is formed between adjacent lines of the conductive material. Optionally, the oxide may be disposed in such a way between the lines that air gaps 37 are being formed in the oxide fill 36. FIG. 13 shows a cross-sectional view of an example of a substrate after performing these processing steps.

Thereafter, for defining the contact plugs, further resist material may be applied and patterned. The pattern of resist layer 38 is selected, so that at those locations at which the contact plugs are to be formed, a resist pad 38 is formed. The formation of these resist pads may be accomplished by generally known methods. FIGS. 14A and 14B show views of the resulting structure. FIG. 14A shows a cross sectional view of an example of a resulting structure. As is shown, a resist plug 38 is formed above a portion of the second conductive layer 33. FIG. 14B shows a plan view of an example of the resulting substrate. As is shown, resist plugs 38 are formed over the pattern of conductive lines 39 and spaces 36.

Figure 16A:
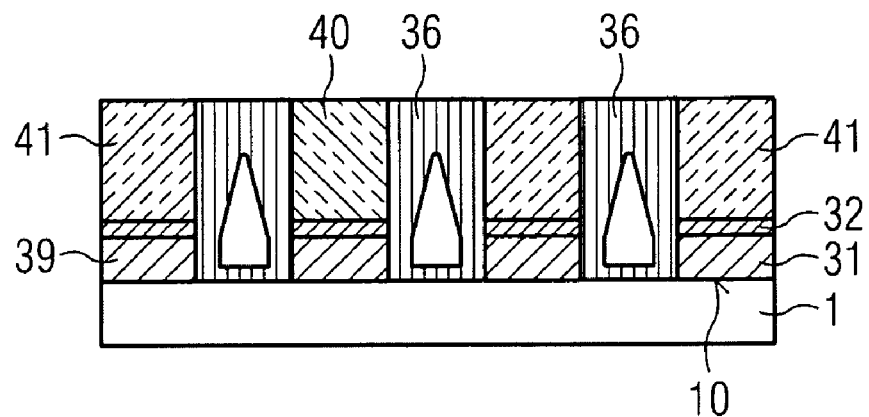

Thereafter, an etching step is performed to remove the uncovered portions of the second conductive layer 33. For example, an anisotropic plasma etching step may be performed that is selective with respect to the etch stop layer 32 as well as to the insulating material filling the spaces between adjacent conductive lines 39. Thereafter, the remaining portions of the resist pads 38 are removed. FIGS. 15A and 15B show views of an example of a substrate after these processing steps. As is shown in FIG. 15A, now, portions of second conductive layer 33 remain at those portions that where previously covered by resist pad 38. These portions of second conductive layer 33 now form a contact plug 40. Moreover, FIG. 15B shows a plan view of an example of the substrate. As is shown, conductive lines 39 are insulated from each other by the insulating material 36. Contact plugs 40 are disposed so as to be in contact with some of the conductive lines 39. Due to this special manufacturing method, a self-alignment of the contact plugs 40 and the first conductive lines 39 is accomplished. Accordingly, short circuits that may be caused by misalignment of contact plugs 40 may be avoided. Thereafter, a second insulating material 41, for example, silicon oxide, may be formed to fill the spaces between adjacent portions of the oxide fill 36. Excess material may be removed by CMP or a recess etch to uncover the contact plugs 40 and to obtain a smooth surface. FIG. 16A shows a cross sectional view of an example of the resulting structure. The conductive lines 39 are insulated from each other by the insulating filling 36.

Figure 16B:
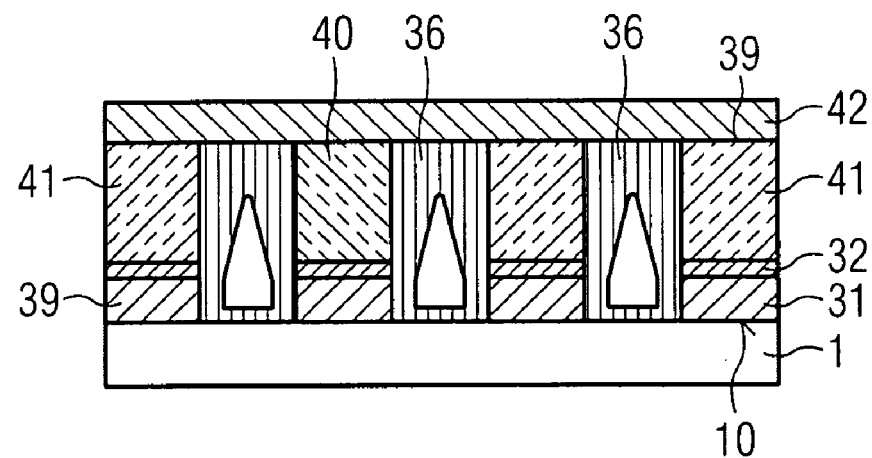

On top of the structure shown in FIG. 16A, a further wiring layer including conductive lines 42 may be formed. As is shown in FIG. 16B, an insulating material comprising the insulating filling 36 as well the second insulating filling 41 insulates the wiring layer including conductive lines 39 from the wiring layer including conductive lines 42. Contact plugs 40 are disposed so as to connect conductive lines 39 with the conductive lines 42 lying above. The conductive lines 42 may be formed by forming a further conductive layer on top of the insulating material 36, 41 and by patterning the conductive layer to form conductive lines 42. Alternatively, the conductive lines of the higher metallization layer may as well be formed by a damascene process as is generally known. For example, a suitable insulating layer may be formed and patterned to form spaces which are to be filled with a suitable conductive material.

As is shown in FIG. 16B, an integrated circuit may comprise first conductive lines 39, wherein the first conductive lines 39 are arranged within a first metallization level. The first conductive lines 39 may comprise a first conductive material. The integrated circuit may further comprise second conductive lines 42, wherein the second conductive lines 42 are arranged in a second metallization level over the first metallization level. The integrated circuit may further comprise contact structures 40 being in electrical contact with one of the first and one of the second conductive lines 39, 42, wherein the second conductive lines are arranged over the contact structures. Each of the contact structures 40 may comprise a second conductive material 33, the second conductive material 33 being in contact with the second conductive lines 42. An intermediate layer is disposed between the first and the second conductive material. A boundary between the second conductive material 33 and the intermediate layer 32 forms a horizontal line without vertical components. The intermediate layer 32 is the etch stop layer as has been described above. Depending on the structure of the contact plugs 40 and the first conductive lines 39, the intermediate layer 32 may form part of the first conductive lines 39. For example, if the step for etching the second conductive material 33 and the intermediate layer 32 to form the contact plugs removes the intermediate layer from the first conductive lines 39, the intermediate layer 32 forms part of the contact plugs.

The step for etching the second conductive material 33 and the intermediate layer 32 to form the contact plugs may also be implemented in such a manner that the intermediate layer remains over the first conductive lines 39. In this case, the intermediate layer 32 forms part of the first conductive lines 39.

Accordingly, an integrated circuit may comprise first conductive lines, wherein the first conductive lines are arranged in a first layer, second conductive lines, wherein the second conductive lines are arranged in a second layer over the first layer, and contact structures being in contact with the first and the second conductive lines, wherein the contact structures are arranged in a self aligned manner to the first conductive lines.

The first and the second conductive lines may extend along a first direction. The contact structures may be arranged along a line which extends in a second direction. The second direction may run perpendicular to the first direction.

The first conductive lines may comprise a first material and the second conductive lines may comprise a second material being different from the first material. Alternatively, the first conductive lines comprise a first material, and the second conductive lines comprise the first material.

Depending on the specific etching process employed, the diameter d of the contact plugs 40 may be decreased in the upper portion thereof. As a consequence, the contact plugs 40 may have a tapered shape, the diameter thereof being smaller in the upper portion than in the lower portion. As is shown in FIG. 16C, an angle α between an upper horizontal line and a sidewall of the contact structures 40, the angle α being measured within the contact structure 40, may be 90° or more.

As has been described above, contact plugs may be formed by patterning a conductive layer into a line/spaces pattern and, thereafter, removing a top portion of the conductive layer, so that the conductive material remains only at those positions at which the contact plugs are to be formed. As becomes apparent to the person skilled in the art, according to an embodiment, the layer stack for forming the conductive lines and the contact structures may comprise only one single layer instead of the layer stack comprising the first conductive layer, the intermediate layer and the second conductive layer. Accordingly, for implementing the method as described herein, this single conductive layer may be patterned to form conductive lines. Thereafter, the positions, at which the contact structures are to be formed, are covered with a resist material. Then, an etching step is performed to remove the upper portion of the single conductive layer at those positions where no contact structure is to be formed. For example, this may be a time controlled etching step.

Figure 17B:
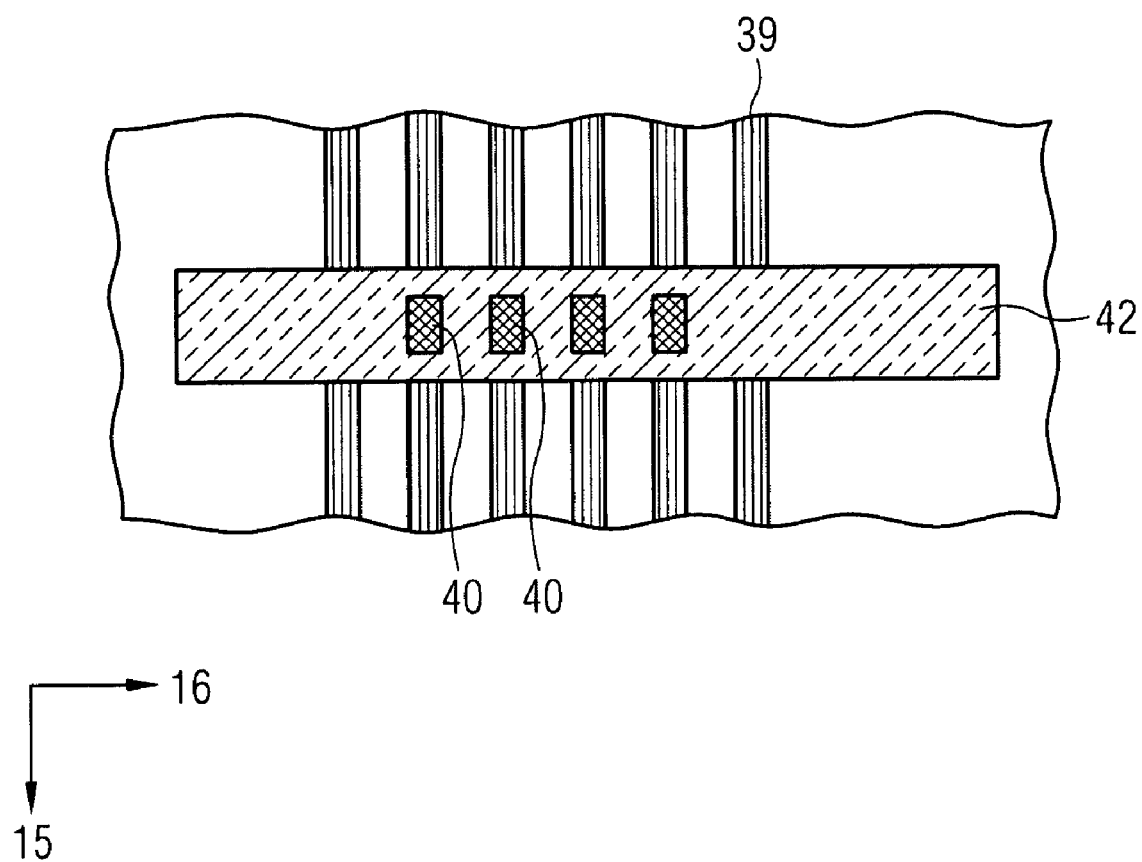

According to a further embodiment, contact plugs that are connected to adjacent conductive lines 39 can be formed by a common resist pad. For example, a resist line for defining a number of contact plugs may be formed. Such a common resist pad may cover portions of the conductive top layer 33 and of the insulating filling 36 at positions at which the contact plugs are to be formed. FIG. 17A shows a plan view of a substrate when a plurality of conductive lines is covered with a resist pad 43 having the shape of a segment of a line. As is shown, by varying the width w of the resist pad 43, the length of the contacts 40 and, thus, the contact resistance of the contacts may be varied. FIG. 17B shows a plan view of a substrate including a second conductive line 42 that is arranged to run perpendicularly with respect to the first conductive lines 39. Since the contacts 40 are arranged along a line, the width of the second line can be adapted so that the second line 42 contacts all of the contacts 40.

Figure 18A:
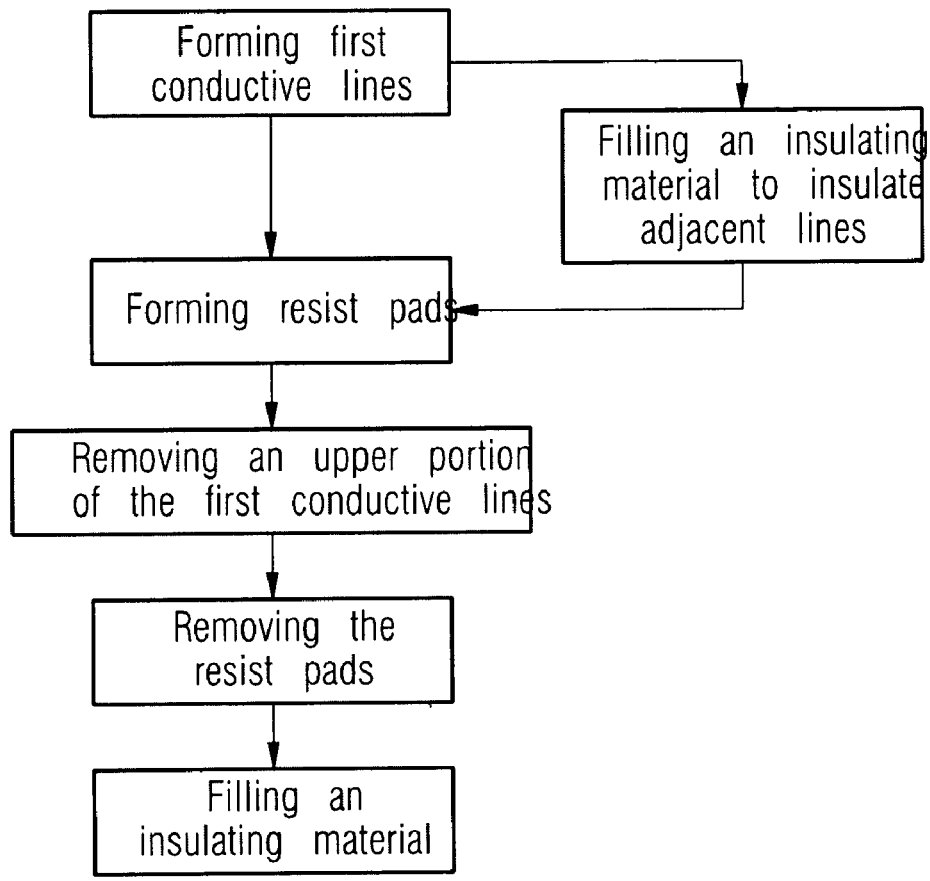
FIGS. 18A and 18B show flow charts of a method according to a further embodiment.

FIGS. 18A and B schematically illustrate a method of forming an integrated circuit according to the embodiment that has been illustrated above. As is shown in FIG. 18A, a method of forming an integrated circuit may comprise forming first conductive lines, adjacent first conductive lines being separated from each other by an insulating material, forming resist pads to cover locations of the first conductive lines, removing an upper portion of the first conductive lines at uncovered portions with respect to the insulating material to form spaces between adjacent lines of the insulating material, removing the resist pads to uncover contact plugs, and filling an insulating material into the spaces. Optionally, an insulating material may be filled to insulate adjacent lines. According to an embodiment, the method may further comprise forming second conductive lines over the insulating material, wherein individual ones of the second conductive lines are connected with the first conductive lines via the contact plugs. According to an embodiment, forming the first conductive lines may comprise patterning a layer stack comprising a bottom layer and a top layer and removing the upper portion of the first conductive lines may comprise removing the top layer with respect to the bottom layer. The layer stack may further comprise an intermediate layer, the intermediate layer being disposed between the bottom layer and the top layer. The material of the bottom layer may be the same as the material of the top layer.

According to an embodiment, the resist pads may be arranged to form a line. The first conductive lines may extend along a first direction, and the resist pads may form a line extending along a second direction being different from the first direction. According to an embodiment, an integrated circuit may be manufacturable by the method as discussed above.

Figure 18B:
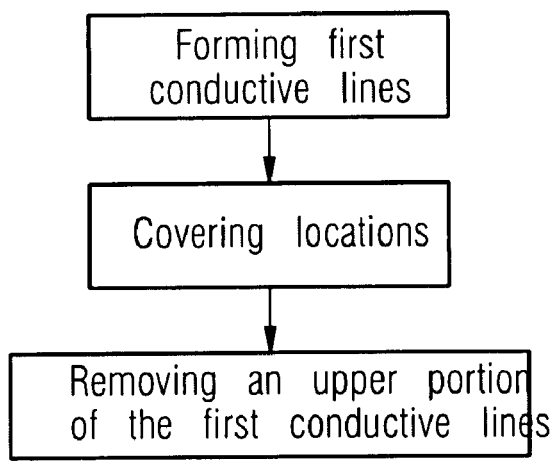

As is shown in FIG. 18B, according to another understanding, a method of forming an integrated circuit may comprise forming first conductive lines, covering locations, at which a contact is to be formed, with a resist material, while non-contact portions remain uncovered, and removing an upper portion of the conductive lines from the non-contact portions.

Forming the first conductive lines may comprise patterning a layer stack comprising a bottom layer and a top layer and removing an upper portion of the conductive lines may comprise removing the top layer. The method may further comprise forming an insulating layer to cover the non-contact portions. The method may further comprise forming second conductive lines over the insulating layer. The layer stack may further comprise an intermediate layer that is disposed between the bottom layer and the top layer.

What is claimed is:

1. An integrated circuit comprising:
   a plurality of separate continuous first conductive lines, wherein the plurality of first conductive lines are arranged within a first metallization level and extend along a first direction;
   a plurality of separate continuous second conductive lines, wherein the plurality of second conductive lines are arranged in a second metallization level over the first metallization level and extend in the first direction;
   a plurality of contact structures, each of the plurality of contact structures being in electrical contact with an associated one of the plurality of first and one of the plurality of second conductive lines and being arranged along a line that extends into a second direction,
   wherein the plurality of second conductive lines are arranged over the contact structures, and wherein a pitch of adjacent contact structures is equal to a pitch of adjacent second conductive lines and wherein a distance between adjacent contact structures is smaller than 100 nm.

2. The integrated circuit according to claim 1, wherein the second direction is perpendicular to the first direction.

3. The integrated circuit according to claim 1, wherein the plurality of first conductive lines comprise a first material and the plurality of second conductive lines comprise a second material being different from the first material.

4. The integrated circuit according to claim 1, wherein the plurality of first conductive lines comprise a first material and the plurality of second conductive lines comprise the first material.

5. The integrated circuit according to claim 1, wherein the distance between neighboring contact structures is smaller than 80 nm.

6. The integrated circuit according to claim 5, wherein the distance between neighboring contact structures is smaller than 50 nm.

7. An integrated circuit comprising:
   a plurality of separate first conductive lines comprising a first conductive material, wherein the plurality of first conductive lines are arranged within a first metallization level;
   a plurality of separate second conductive lines, wherein the plurality of second conductive lines are arranged in a second metallization level over the first metallization level;
   a plurality of contact structures, each of the plurality of contact structures being in electrical contact with an associated one of the first and an associated one of the second conductive lines, wherein the plurality of second conductive lines are arranged over the plurality of contact structures, and wherein each of the plurality of contact structures comprises a second conductive material, the second conductive material being in contact with the plurality of second conductive lines, a boundary between the plurality of contact structures and an intermediate layer forming a horizontal line without vertical components, the intermediate layer being disposed between the plurality of separate first conductive lines and the plurality of contact structures.

8. The integrated circuit of claim 7, wherein the second conductive material is the same as the first conductive material.

9. The integrated circuit of claim 7, wherein a diameter of an upper portion of the plurality of contact structures is smaller than a width of the first conductive lines.

10. The integrated circuit of claim 7, wherein a pitch of adjacent contact structures is equal to a pitch of adjacent first conductive lines.

11. The integrated circuit of claim 7, wherein a distance between adjacent contact structures is smaller than 100 nm.

* * * * *